United States Patent
Kanazawa et al.

(10) Patent No.: US 8,421,351 B2
(45) Date of Patent: Apr. 16, 2013

(54) HOT-MELT TYPE MEMBER AND ORGANIC EL DISPLAY PANEL

(75) Inventors: Shigeo Kanazawa, Nomi (JP); Konosuke Uozumi, Nomi (JP); Taketoshi Nakayama, Nomi (JP); Toshie Isono, Nomi (JP); Yohei Kawaguchi, Nomi (JP)

(73) Assignee: Komatsu Seiren Co., Ltd., Nomi, Ishikawa (JP)

( * ) Notice: Subject to any disclaimer, the term of this patent is extended or adjusted under 35 U.S.C. 154(b) by 182 days.

(21) Appl. No.: 12/297,826

(22) PCT Filed: Apr. 12, 2007

(86) PCT No.: PCT/JP2007/058040
§ 371 (c)(1),
(2), (4) Date: Oct. 20, 2008

(87) PCT Pub. No.: WO2007/123039
PCT Pub. Date: Nov. 1, 2007

(65) Prior Publication Data
US 2009/0174304 A1 Jul. 9, 2009

(30) Foreign Application Priority Data
Apr. 18, 2006 (JP) .................. 2006-114748

(51) Int. Cl.
*H05B 33/04* (2006.01)
(52) U.S. Cl.
USPC .......... 313/512; 313/504; 313/506; 428/690; 428/917

(58) Field of Classification Search .................. 313/512
See application file for complete search history.

(56) References Cited

U.S. PATENT DOCUMENTS

| | | | | | |
|---|---|---|---|---|---|
| 4,456,649 | A | * | 6/1984 | Clarke | 428/74 |
| 5,063,271 | A | * | 11/1991 | Jones | 524/351 |
| 6,112,888 | A | * | 9/2000 | Sauro et al. | 206/204 |
| 6,562,452 | B2 | * | 5/2003 | Ferri | 428/331 |
| 6,737,176 | B1 | * | 5/2004 | Otsuki et al. | 428/690 |
| 6,777,481 | B2 | * | 8/2004 | Chu | 524/450 |
| 6,936,131 | B2 | * | 8/2005 | McCormick et al. | 156/292 |
| 2002/0015818 | A1 | | 2/2002 | Takahashi et al. | |

(Continued)

FOREIGN PATENT DOCUMENTS

| | | |
|---|---|---|
| EP | 1014757 A2 | 6/2000 |
| EP | 1021070 A1 | 7/2000 |

(Continued)

OTHER PUBLICATIONS

European Search Report dated Nov. 12, 2009, issued in corresponding European Patent Application No. 07741476.1.

(Continued)

*Primary Examiner* — Sikha Roy
(74) *Attorney, Agent, or Firm* — Westerman, Hattori, Daniels & Adrian, LLP

(57) ABSTRACT

The present invention provides a thin organic EL element that can maintain stable emission characteristics for a long time without being affected by water or oxygen. Specifically, the present invention provides an organic EL display panel having a substrate (1), an organic EL element (2) formed on the substrate; and a case (3) encapsulating the organic EL element, wherein a specific hot melt-type member is arranged between the organic EL element and the case.

13 Claims, 1 Drawing Sheet

U.S. PATENT DOCUMENTS

| | | |
|---|---|---|
| 2003/0110981 A1 | 6/2003 | Tsuruoka et al. |
| 2004/0189195 A1* | 9/2004 | Allemand .................... 313/512 |
| 2005/0227114 A1* | 10/2005 | Tanaka et al. ................ 428/690 |
| 2006/0024524 A1* | 2/2006 | Tachikawa .................... 428/690 |
| 2006/0066224 A1* | 3/2006 | Ito ................................ 313/504 |
| 2006/0169992 A1* | 8/2006 | Nakata ............................ 257/82 |

FOREIGN PATENT DOCUMENTS

| | | |
|---|---|---|
| JP | 58-174474 A | 10/1983 |
| JP | 61-230720 A | 10/1986 |
| JP | 64-14080 A | 1/1989 |
| JP | 11-293230 A | 10/1999 |
| JP | 2000-68047 A | 3/2000 |
| JP | 2000-195661 A | 7/2000 |
| JP | 2002-33187 A | 1/2002 |
| JP | 2003-144830 A | 5/2003 |
| JP | 2006-68729 A | 3/2006 |
| WO | WO 2005041312 A1 * | 5/2005 |

OTHER PUBLICATIONS

International Search Report of PCT/JP2007/058040, date of mailing Jun. 26, 2007.

* cited by examiner

HOT-MELT TYPE MEMBER AND ORGANIC EL DISPLAY PANEL

TECHNICAL FIELD

The present invention relates to a hot melt-type member and an organic EL display panel. Specifically, the present invention relates to a sealing member for an organic EL element, and an organic EL display panel using the sealing member. In particular, the present invention relates to a technique that reliably allows mass production of thin organic EL display panels that can maintain stable emission characteristics for a long period of time, without being deteriorated by water or oxygen.

BACKGROUND ART

An organic EL element is provided, on a glass substrate, with an ITO (Indium Tin Oxide) transparent electrode (anode), an organic film (organic hole transport layer, organic light-emitting layer, etc.) and a metal electrode (cathode). However, it is known that the organic film or metal electrode in such an organic EL element is easily deteriorated by water, oxygen, heat and organic gas (this may be referred to as "outgas") emitted from the constituent components. In order to extend the product life of the organic EL elements, deterioration due to water, oxygen, heat and outgas should be prevented. Specific means thereof include placing the organic EL elements in an atmosphere free from water and oxygen, reducing the outgas emitted from the constituent components, employing a structure by which the heat generated when light is emitted from the organic EL element can be efficiently released, etc.

Specifically, as shown in FIG. 1, an organic EL element (including anode 2, organic layer 3, and cathode 4) is formed on a glass or like substrate 1, a sealing cap 5 formed of glass or metal is placed on the organic EL element's side of the substrate 1, and the sealing cap 5 is adhered to the substrate 1 using a sealant 6, so that the organic EL element is encapsulated in a hermetically sealed container formed from the substrate 1 and the sealing cap 5. In order to capture moisture, barium oxide (BaO), calcium oxide (CaO) or a sheet-like water-capturing agent 7 using barium oxide (BaO) or calcium oxide (CaO) is sealed in the hermetically sealed container.

An example of an organic EL display panel using a water-capturing agent is an organic EL element provided with a transparent electrode formed of a transparent electrode material on a transparent substrate surface; a light-emitting layer that is formed of an EL material and placed on the transparent electrode; a back electrode that is opposed to the transparent electrode and formed on the light-emitting layer; a water-repellant film that completely covers the light-emitting layer and the back electrode; and an electric non-conductive protecting member that seals the light-emitting layer together with the water-repellant film (Patent Document 1).

(Patent Document 1) Japanese Unexamined Patent Publication No. 2000-68047

DISCLOSURE OF THE INVENTION

Problem to be Solved by the Invention

One of the features of the organic EL display panel shown in FIG. 1 is that a sealing cap 5 for sealing the organic EL element on the substrate 1 is provided with a water-capturing agent, e.g., BaO powder, CaO powder, or a sheet-like water-capturing agent 7 containing the powder of BaO or CaO. When a necessary amount of the water-capturing agent is supplied in a sealing cap 5, the thickness is about 0.2 mm at minimum, and therefore the sealing cap 5 necessarily has a depth in the recessed portion of at least 0.3 to 0.5 mm. Accordingly, the sealing cap 5 needs a thickness of at least 0.7 to 1.0 mm, which increases the thickness of the organic EL display panel.

In organic EL display panels using the sealing cap 5, when the light-emitting area is enlarged, the strength of the organic EL display panel is reduced, or the sealing cap 5 is easily bent and may come in contact with the cathode due to the hollow structure of the hermetically sealed container. This reduces the reliability of the light-emitting element.

An example of a thin-film coating using a transparent water absorbing material (organic water-capturing agent) is Ole-Dry® (Futaba Corporation). However, this thin film has a physical problem: specifically, when the amount of water absorbed increases, cracks gradually appear and eventually damage the organic EL element. Furthermore, because Ole-Dry® is a special liquid, a special coating technique is required.

An object of Patent Document 1 is to suppress the deterioration of an organic EL element by preventing the adhesion of water thereto by forming a water-repellant film on the organic EL element, wherein the water-repellant film is formed of a single component selected from wax, fluorine-based water-repellant, silicon-based water-repellant, etc. When a water-capturing agent is used in combination, particles with relatively large diameters, e.g., about 100 to 500 µm, are used, or particles are applied after forming a water-repellant coating film, etc. In other words, the main purpose of using particles in Patent Document 1 is not the formation of a water-capturing agent layer. Patent Document 1 does not aim to obtain a thin organic EL display panel using a water-capturing agent in combination.

In Patent Document 1, a water-capturing agent powder having a relatively large particle diameter of 100 to 500 µm is used without crushing. Such a large water-capturing agent powder cannot be used in an actual production process. Furthermore, in Patent Document 1, the water-repellant layer is formed by depositing wax. Therefore, depending on the type of wax used, the organic EL element performance may be deteriorated by the evaporated wax.

A major object of the present invention is to solve the above problem. In particular, the main object of the present invention is to provide a thin organic EL display panel that can maintain stable emission characteristics for a long time without being adversely affected by water and oxygen.

Means for Solving the Problem

The present inventors conducted extensive research to overcome the problems of the prior art techniques, and found that such an object can be achieved by using a material containing specific components at a specific ratio. The present invention has thus been accomplished.

Specifically, the present invention provides hot melt-type members and organic EL display panels as below:

Item 1. A hot melt-type member comprising a water-capturing agent and wax.

Item 2. The hot melt-type member according to Item 1, wherein the wax is microcrystalline wax.

Item 3. The hot melt-type member according to Item 1, wherein the water-capturing agent is at least one member selected from the group consisting of 1) organic metal compounds and 2) inorganic oxide powders having an average particle diameter of not greater than 90 µm.

Item 4. The hot melt-type member according to Item 1, wherein the content of the water-capturing agent is 50 to 99 wt. % per total weight of the hot melt-type member.

Item 5. The hot melt-type member according to Item 1, wherein the content of the wax is 1 to 50 wt. % per total weight of the hot melt-type member.

Item 6. The hot melt-type member according to Item 1, wherein the decrease in weight after conducting vacuum-drying at 150° C. for 4 hours is not greater than 0.1%.

Item 7. The hot melt-type member according to Item 1, which is in the form of a thin film having a thickness of not greater than 100 μm.

Item 8. The hot melt-type member according to Item 1, which is used in a case of an electronic device encapsulated in the case.

Item 9. The hot melt-type member according to Item 8, wherein the electronic device is an organic EL display panel, organic solar cell or organic semiconductor.

Item 10. A transferring film comprising the hot melt-type member of Item 1 on a releasing substrate.

Item 11. An organic EL display panel comprising:
a substrate (1);
an organic EL element (2) formed on the substrate; and
a case (3) encapsulating the organic EL element,
wherein the hot melt-type member of Item 1 is located between the organic EL element and the case.

Item 12. The organic EL display panel according to Item 11, wherein the space between the organic EL element and the case is substantially occupied by the hot melt-type member.

Effect of the Invention

The hot melt-type member of the present invention melts at high temperatures. This allows the formation, with a desirable pattern and thickness, of a hot-melt member layer that contains a water-capturing agent and closely adheres to an organic EL element without a space therebetween on a case (hereunder, this may be referred to as a "sealing case"), an organic EL element, etc. This also reduces the generation of outgas, and therefore provides an electronic device (for example, an organic EL display panel) that can maintain stable emission characteristics for a long time without being affected by water, oxygen, and outgas.

In particular, unlike when an organic-base water-capturing agent is used alone, the hot melt-type member of the present invention can alleviate or solve the problems of cracking, etc. Additionally, the hot melt-type member of the present invention contributes to the maintenance of stable emission characteristics for a long time of period.

In one example of a preferable embodiment, a powder of BaO, CaO or like inorganic oxide with a small-particle diameter, an organic metal compound (including organic metal complexes. This can also be applied to the explanation below), or a sheet-like (thin film) hot-melt member using such materials is used. This makes the use of a thick sealing cap (sealing case) 5 having a recessed portion unnecessary; therefore, a flat, thin sealing plate can be used as a sealing case.

In another preferable embodiment, the hot melt-type member of the preferable embodiment of the present invention is arranged between a substrate and a sealing case without a space. This arrangement reduces the thickness of the resulting organic EL display panel, and therefore can be used in large-sized displays.

When a transparent wax is used, by using a transparent water-capturing agent in a combined manner, a transparent thin film layer having water-capture abilities can be formed on a cathode. Such an arrangement achieves a top emission display wherein the light emitted from the organic EL light-emitting layer can be output from the cathode.

BEST MODE FOR CARRYING OUT THE INVENTION

1. Hot Melt-Type Member

A main feature of the hot melt-type member of the present invention is that it contains a water-capturing agent (hereunder sometimes referred to as a "humidity getter") and wax.
(Water-Capturing Agent)

There is no limitation to the water-capturing agents as long as they are known as water-capturing agents, and may be inorganic water-capturing agents or organic water-capturing agents. Specific examples thereof include barium oxide (BaO), calcium oxide (CaO), strontium oxide (SrO) and like inorganic oxide powders, and organic metal compounds known as transparent humidity getters. These water-capturing agents may be used singly or in combination. Commercially available water-capturing agents may also be used.

When a powder water-capturing agent, such as the above-mentioned inorganic oxide powder, is used, the average particle diameter is generally less than 100 μm, preferably not greater than 90 μm, more preferably not greater than 50 μm, and particularly preferably not less than 0.01 μm and not greater than 10 μm. Setting the average particle diameter to less than 100 μm reduces the damage to an organic EL element and eliminates the need to form a recessed portion in the sealing case when fabricating an organic EL display panel. If the particle diameter is smaller than 0.01 μm, the particles may scatter, or the production cost of the particles may increase.

Among these water-capturing agents, in the present invention, it is preferable that at least one member selected from the group consisting of 1) organic metal compounds and 2) inorganic oxide powders having an average particle diameter of not greater than 90 μm be used. In view of the mixability with wax and adherence to an organic EL element, etc., it is preferable to use, as the water-capturing agent, organic metal compounds that dissolve in the same solvent used for dissolving the wax. When the hot melt-type member of the present invention is used in a top emission-type organic EL display panel or the like, wherein the light emitted from the organic EL light-emitting layer is also output from the cathode, the use of a transparent water-capturing agent is preferable. Examples of transparent water-capturing agents include powders having a particle diameter of not greater than 100 nm, and organic metal compounds. The organic metal compounds disclosed in Japanese Unexamined Patent Publication No. 2005-298598 may be suitably used.

The content of the water-capturing agent can be suitably selected depending on the type of the water-capturing agent; however, it is generally about 50 to 99 wt. % and preferably about 80 to 99 wt. % per the total weight of the hot melt-type member of the present invention. If the content of the water-capturing agent is less than 50 wt. %, the water-capturing ability may be lowered; if it exceeds 99 wt. %, contact with and adhesion to the organic EL element of the hot melt-type member, as well as the retentivity of the water-capturing agent, may be lowered.
(Wax)

There is no limitation to the waxes, as long as they can allow the hot melt-type member of the present invention to melt at high temperatures; they may be suitably selected from known and commercially available waxes. Specific examples thereof include paraffin waxes, microcrystalline waxes and the like. These waxes may be used singly or in combination.

From the viewpoint of the production process or the like, it is preferable that the wax have a melting point of 60 to 100° C. If the melting point of the wax is below 60° C., there is a risk that the organic substances (the organic EL elements, etc.) may melt or swell. If the melting point of the wax exceeds 100° C., a temperature above 100° C. is necessary to soften or melt the hot-melt member, and organic substances (organic EL element, etc.) may also be subjected to such a high temperature; this may cause the organic substances to deteriorate.

In the present invention, the use of microcrystalline waxes is particularly preferable in view of preventing the generation of an outgas that would adversely affect the organic EL element, and achieving excellent adhesion with a glass substrate and like substrates, sealing case, and organic EL element.

The content of the wax may be suitably selected depending on the type of wax used. However, the content of the wax is generally about 1 to 50 wt. %, and preferably 1 to 10 wt. % per total weight of the hot melt-type member of the present invention. If the wax content exceeds 50 wt. %, the water-capturing ability may be insufficient. A wax content of less than 1 wt. % may lower the contact with and adherence to the substrate, etc., and reduce the prevention effect of cracking over time caused by capturing water when an organic metal compound is used as a water-capturing agent. In view of obtaining a transparent hot-melt member, the wax content in the hot-melt member is preferably not greater than 10 wt. %.

When the hot melt-type member of the present invention is used in, for example, a top emission-type organic EL display panel wherein light emitted from the organic EL light-emitting layer is also output from the cathode, the wax is desirably transparent. This may be achieved when the wax itself is transparent, by suitably selecting the content of the wax in the hot-melt member, or by making the layer formed of the hot-melt member thin. By suitably selecting the type of wax, the type and content of the water-capturing agent, and the combination thereof, it is possible to obtain a hot-melt member usable in a top emission-type display wherein the light emitted from the organic EL light-emitting layer is also output from the cathode.

(Hot-Melt Member)

The hot melt-type member of the present invention may consist of the two above-mentioned components, i.e., a water-capturing agent, and a wax; however, the member may also contain various additives, if necessary.

There is no limitation to the shape of the hot melt-type member of the present invention, which may be formed into a desirable shape depending on its application. For example, the hot melt-type member of the present invention may have a thin film-like shape, a plate-like shape, an indefinite shape, etc. In the present invention, a thin film-like shape is preferable. In this case, the thickness thereof is not limited, but generally not greater than 100 μm, and preferably about 5 to 50 μm.

The hot melt-type member of the present invention is usually in solid form after drying (solvent-thinned type) or cooling (non-solvent type), and is used as a component for electronic devices. However, when used in lamination on an organic EL element, sealing case, releasing substrate, etc., it may be in a viscous state. Specifically, it may be softened or melted by heat, or dissolved in an organic solvent when used. This makes it possible to laminate the hot melt-type member of the present invention on an organic EL element, sealing case, etc., in a closely adhered manner. In this structure, the water-capturing agent is adhered to the organic EL element, etc., so that the organic EL element is protected from various factors, such as water entering the hermetically sealed container, moisture inherently contained in the organic EL element, an outgas, etc.

When the hot melt-type member of the present invention is adhered or coated after being softened or melted by heating, the hot melt-type member can be formed into a desirable shape, such as a thin film-like shape formed by the following process. The hot melt-type member is heated until it is softened or melted, and then adhered or coated onto a substrate (on a laminated surface of an organic EL element), sealing case, etc. When such a thin film-like hot melt-type member is used, it can be adhered (welded) to the substrate etc., by softening or melting only a part thereof.

In the method of using the hot melt-type member after softening or melting by heating, for example, when a thin film is formed by coating, a thin film can be effectively obtained by heating the coating head to about 70 to 80° C. This can reduce the drying time after coating, increasing productivity and reducing the risk of outgas generation.

The following process is particularly preferable to prevent the generation of outgas. Specifically, the non-solvent hot melt-type member mentioned below is softened by heating, and then laminated on an organic EL element, sealing case, etc.

(Transferring Film)

In the present invention, laminating a thin film-like hot melt-type member on a releasing substrate (a releasing film) is particularly preferable, because such a lamination is usable as a transferring film. One example of such a hot melt-type member used as a transferring film is as follows. When fabricating organic EL display panels, organic solar cells, organic semiconductors or like electronic devices, such hot melt-type members are stored as transferring films and taken out when necessary, so that the hot melt-type member can be easily placed on an organic EL element or like electronic device by transferring the hot melt-type member on a releasing substrate to the organic EL element or like electronic devices.

The thickness of the hot melt-type member on a releasing substrate is preferably not greater than 100 μm, more preferably about 5 to 50 μm.

A known or commercially available releasing substrate may be used. However, a preferable releasing substrate comprises an alkyd-type releasing agent applied to the surface of a resin film. The hot melt-type member on a releasing substrate may be transferred from a releasing substrate to a sealing case before use. One production method of the transferring film is as follows. The hot melt-type member is melted by heating or using a solvent, applied to the surface of a releasing substrate, and then the organic solvent is volatilized by cooling or heating so that a thin film-like hot-melt member can be laminated on a releasing substrate.

(Production Method of Hot-Melt Member)

The hot melt-type member of the present invention may be produced by merely uniformly mixing a water-capturing agent, wax, and additives, if necessary. The mixing may be conducted by adding heptane, triethanolamine and like organic solvents before mixing; or by melting the wax by heating without adding an organic solvent, followed by mixing. From the viewpoint of mixability, it is preferable to use a solvent, in which both the water-capturing agent and wax can dissolve.

Examples of usable mixing equipment include agitators, kneaders and like known mixing apparatuses and kneading apparatuses. After uniformly mixing all of the components, the material may be formed into a desirable shape, if necessary.

After mixing, it is desirable that the solvent component be removed from the hot melt-type member of the present invention by heating and drying. The extent of removal is preferably such that the reduction of weight is not greater than 0.1% after subjecting the member to vacuum-drying at 150° C. for 4 hours. In other words, a hot melt-type member whose reduction of weight was not greater than 0.1% after drying under vacuum at 150° C. for 4 hours is preferably used as the hot melt-type member of the present invention (i.e., a non-solvent hot melt-type member). If the reduction of weight after vacuum-drying exceeds 0.1%, outgas generates when used as a sealing panel for an organic EL case, which may deteriorate the organic EL element.

The hot melt-type member of the present invention is suitably usable for, in particular, electronic devices. Specifically, the hot melt-type member described above is used in a sealing case of an electronic device that is encapsulated in the sealing case. The hot melt-type member of the present invention is a mixture of a water-capturing agent and a wax. The hot melt-type member of the present invention is usable as a sealing material to seal the organic EL element in a hermetically sealed container of an electronic device, such as an organic EL display panel. The hot melt-type member of the present invention is also usable as an adhesive to assemble and/or adhere substrates and like constitutional components that form the hermetically sealed container. The hot melt-type member of the present invention also functions as a water-capturing agent that absorbs water that enters into the hermetically sealed container, moisture inherently contained in the organic EL element, etc. The hot melt-type member of the present invention is a multi-function material having such functions.

2. Organic EL Display Panel

The present invention encompasses an organic EL display panel that comprises a substrate (1), an organic EL element (2) formed on the substrate and a case (casing member) (3) encapsulating the organic EL display panel, wherein the hot melt-type member of the present invention is arranged between the organic EL element and the case.

In the present invention, the substrate means a glass plate, etc., that forms an organic EL element. The organic EL element means a laminate having at least an organic light-emitting layer between an anode and a cathode. In the present invention, there is no limitation to the form of the case, as long as it can encapsulate the organic EL element to seal it from outside air; it can be formed into, for example, a box-like form, or a plate-like form.

In the organic EL display panel of the present invention, the hot melt-type member is provided between the substrate and the sealing case. The configuration/structure of the organic EL element may be the same as that of known organic EL elements. Accordingly, the hot melt-type member of the present invention is basically applicable to all types of known organic EL display panels.

The hot melt-type member of the present invention can be obtained by mixing and agitating the above-described wax and water-capturing agent. A specific structure of the organic EL display panel using this hot melt-type member is explained below, with reference to FIG. 2.

In FIG. 2, an anode 2, organic layer 3, and cathode 4 are laminated on a substrate 1 as an organic EL element, and a short circuit prevention layer 8 is further laminated thereon. On the organic EL element, a hot melt-type member obtained by adding a water-capturing agent to wax is provided as an adhesive layer 9. The adhesive layer 9 is solidified to adhere a sealing case 10.

In the present invention, a short circuit prevention layer may be provided, if necessary. The short circuit prevention layer is formed to prevent short circuits between the cathode and the anode. Usable materials for the short circuit prevention layer include silicon oxide, aluminium oxide, silicon nitride, silicon carbide and like inorganic materials, polyparaxylene and like organic materials. In the present invention, it is preferable that the short circuit prevention layer be formed of polyparaxylene (a polyparaxylene-based insulating layer).

A polyparaxylene-based insulating layer is formed of polyparaxylene and/or its derivatives. There is no limitation to the derivatives, as long as they have paraxylene as a base unit, and known or commercially available ones may be used. Preferable examples of commercially available polyparaxylene include the products "diX C", "diX D", "diX F" and "diX N" (product names, Daisan Kasei Co., Ltd.), etc.

The polyparaxylene-based insulating layer is formed at least on the cathode. In this case, a polyparaxylene derivative layer is formed so as to cover at least the top surface of the cathode. It is particularly preferable that a polyparaxylene-based insulating layer be formed to cover the top and side surfaces of the cathode. In other words, it is desirable that the entire surface of the cathode be covered with a polyparaxylene-based insulating layer. It is also possible to form the polyparaxylene-based insulating layer so as to cover the entire surfaces of the cathode and organic light-emitting layer (organic layer).

The thickness of the polyparaxylene-based insulating layer may be suitably selected depending on the type of the polyparaxylene or a derivative thereof, and the type and form of the organic EL element. However, it is generally about 20 nm to 10 μm, preferably 50 nm to 1 μm, and more preferably 50 nm to 900 nm. By setting the thickness within this range, the occurrence of short circuits can be effectively prevented, and, as a result, the product life can be extended.

There is no limitation to the production method of the polyparaxylene-based insulating layer, as long as the above-described arrangement can be obtained; a vapor phase method, liquid phase method, or solid phase method may be used. In a preferable example of the method, using a material for forming a polyparaxylene-based insulating layer (e.g., paraxylene monomer and/or paraxylene oligomer), a vapor phase method is conducted. In other words, a polyparaxylene-based insulating layer preferably used in the present invention is that obtained by using a polyparaxylene derivative (e.g., paraxylene monomer and/or paraxylene oligomer) as a material and subjecting the material to vapor phase. A polyparaxylene-based insulating layer obtained by using a paraxylene oligomer (preferably, paraxylene dimer) and conducting a vapor phase method is particularly preferable.

Examples of employable vapor phase methods include a CVD method, PVD method, etc. Among these, the CVD method, in particular, a heat CVD method, is preferable. When the heat CVD method is employed, the pyrolysis temperature is preferably set in the range of about 600 to 700° C. Regarding the atmosphere, a vacuum atmosphere of not greater than 1.0 Pa is preferable. The deposition rate may be about 1 to 2 nm/min. The heat CVD method may be conducted using a known or commercially available apparatus.

Known or commercially available polyparaxylene or its derivatives are also usable.

A UV-curable sealant 6 is provided and solidified around the hot melt-type member. The hot melt-type member may be directly applied to a sealing case 10. Alternatively, it is also possible to use a sheet-like (thin film-like) transferring film applied to the top surface of the releasing film, the hot melt-type member is transferred onto a sealing case 10, and the substrate 1 (on the substrate's surface whereon the organic EL element is formed) having an organic EL element laminated thereon and the hot melt-type member on the sealing case are bonded to each other under vacuum. This provides a thin organic EL panel encapsulated in a case that can be mass-produced in a highly reliable manner.

In the structure shown in FIG. 2, by applying a desirable amount of the hot melt-type member on a sealing case 10, and bonding it to the substrate under vacuum, it is possible to make the hot melt-type member cover the organic EL element so that there is no gap between the substrate and the sealing case 10 (such as glass substrate). In other words, it is preferable for the entire space between the organic EL element and the case substantially to be occupied by the hot melt-type member. By arranging the hot melt-type member between the substrate and the sealing case 10 without a gap, i.e., directly adhered to the organic EL element, it is possible to prevent the organic EL element from coming into contact with water, oxygen, and/or outgas. This increases not only the strength of the organic EL display panel, but also the dark spot-prevention ability and irregular reflection-prevention ability of the organic EL element. Here, in order to increase the adhesiveness, vacuum adhesion is conducted after heating a glass substrate and like components used for a sealing case. Furthermore, by applying a UV-curable sealant (epoxy sealant) around the hot melt-type member and solidifying, the sealing performance of the organic EL element can be further improved.

EXAMPLES

The hot melt-type member of the present invention and an organic EL display panel using the same are explained below with reference to Examples and Comparative Examples. However, the scope of the present invention is not limited to the Examples.

The organic EL display panel used in the Examples and Comparative Examples has the structure shown in FIG. 2. Specifically, an ITO transparent electrode 2, which is an anode, is formed on a substrate 1; an organic film 3 including an organic light-emitting layer is formed on the transparent electrode 2; and a metal electrode 4, which is a cathode, is formed on the organic film 3. The organic film 3 is a lamination of, for example, a hole transport layer and an organic light-emitting layer, or a lamination film of an organic light-emitting layer and a metal electrode 4 having an electronic transport layer therebetween. An example of the metal electrode 4 is a lamination of Al with MgAg or LiF. Examples of short circuit prevention layers 8 include paraxylene, etc., as well as silicon oxide ($SiO_2$), aluminium oxide ($Al_2O_3$), silicon carbide (SiC), silicon nitride ($Si_3N_4$) or the like.

Specifically, an organic EL display panel was obtained by forming an organic EL element on a substrate in the following manner. The production of organic EL display panel was conducted in a clean atmosphere, having a cleanliness class of about 1,000 (i.e., 1,000 particles per cubic foot of air). In the process of fabricating organic EL display panels, transportation of the element components was all conducted under a high vacuum atmosphere without being exposed to air.

1) Step 1

A glass substrate having an ITO, which functions as an anode 2, in advance patterned thereon was used as a substrate 1. The substrate 1 was subjected to ultrasonic cleaning using an organic alkaline cleaner "Semicoclean 56" (product name, Furuuchi Chemical Corporation), ultrapure water, acetone, and isopropyl alcohol, in that order. The substrate 1 was then dried by blowing nitrogen.

2) Step 2

The substrate 1 was subjected to a UV/ozone treatment to remove the organic pollutant on the surface of the ITO transparent electrode 2. Immediate afterward, the substrate 1 was placed in a pre-evacuation chamber.

3) Step 3

Subsequently, the substrate 1 was transported into a film-formation chamber, and a shadow mask for use in the formation of an organic film was placed on the substrate 1. By heating an alumina crucible, the formation of organic film 3 was conducted in such a manner that a hole transport material (e.g., a triphenylamine derivative, thickness of 50 nm) and luminescent material (e.g., an amine/quinolinol complex (Alq), thickness of 20 nm) were sequentially applied at a film formation rate of 2 to 4 nm/min. Here, the structure disclosed in Japanese Unexamined Patent Publication No. 2006-24432 may be preferably employed.

4) Step 4

While maintaining the vacuum atmosphere, the organic film formation shadow mask was replaced with a cathode formation shadow mask. The alumina crucible underwent resistance heating, a 1-nm-lithium fluoride film was formed, and then a 200-nm-aluminum film was formed as the cathode 4. The film formation was conducted under a pressure of not greater than $4 \times 10^{-4}$ Pa (i.e., under vacuum) at a rate of 10 to 15 nm/min. Here, the light emission area of the organic EL element having a layered structure of the anode 2, organic film 3 and cathode 4 was 20 mm×30 mm.

In the Examples below, a glass plate without a recessed portion for holding a water-capturing agent was used as the sealing case.

Example 1

(1) Production of Hot Melt-Type Member Containing Inorganic Oxide Water-Capturing Agent Barium oxide (average particle diameter of 20 μm) was used as an inorganic oxide water-capturing agent, and a microcrystalline wax (product name, Hi-Mic-1070; melting point, 79° C.; number of carbons, about 30 to 60; molecular weight, about 500 to 800) was used as the wax. The barium oxide (60 wt. %), microcrystalline wax (30 wt. %), and heptane (10 wt. %) were mixed, obtaining a hot melt-type member.

(2) Coating to Sealing Case (Glass Plate)

In a glove box whose atmosphere was replaced with a nitrogen gas having a dew point temperature of −70° C., the hot melt-type member of the present invention was applied to a sealing case (glass plate) that had been subjected to pre-wash and UV/ozone cleaning using a dispenser in such a manner that the resulting hot melt-type member had a thickness of 50 μm. There is no particular limitation to the coating method, as long as the hot melt-type member can be applied to the top surface of the sealing case (glass plate) by a single wafer process. Thereafter, using a hot plate, the solvent was evaporated by heating at 150° C. for 5 minutes, and a UV-curable sealant was applied to the external peripheral of the sealing case (glass plate).

(3) Adhesion of Substrate with a Sealing Case

The substrate was transferred without being exposed to air into a glove box whose atmosphere was replaced with a nitrogen gas having a dew point temperature of −70° C. The organic EL element on the substrate was placed into contact with and adhered to the hot-melt type member on the sealing case under an atmospheric pressure, and irradiated with ultraviolet rays using a 150 W UV lamp from the substrate side to cure the UV-curable sealant. By the thus-conducted sealing, an organic EL display panel was obtained. In the above-mentioned organic EL display panel, the hot melt-type member is arranged between the substrate and the sealing case with no gap. In this structure, the hot melt-type member is directly adhered to the organic EL element.

Example 2

Production of Hot Melt-Type Member Containing Transparent Water-Capturing Agent

OleDry® (organic metal compound; Futaba Corporation) was used as a transparent water-capturing agent, and a microcrystalline wax (Nippon Seiro Co., Ltd.; product name, Hi-Mic-1070; melting point, 79° C.; number of carbons, about 30 to 60; molecular weight, about 500 to 800) was used as the wax. These components were mixed in a ratio of 80 wt. % OleDry®, 8 wt. % microcrystalline wax, and 12 wt. % heptane, obtaining a hot melt-type member.
Coating to Sealing Case (Glass Plate)

In a glove box whose atmosphere was replaced with a nitrogen gas having a dew point temperature of −70° C., the hot melt-type member of the present invention was applied to a sealing case (glass plate) that had been subjected to a pre-wash and UV/ozone cleaning, using a slot die in such a manner that the resulting hot melt-type member had a thickness of 40 μm (after drying). There is no particular limitation to the coating method, as long as the hot melt-type member can be patterned into a desirable shape on the top surface of the sealing case (glass plate) by a single wafer process. Alternatively, gravure coating, screen printing, or the like may be employed. Thereafter, heating was conducted at 150° C. for 5 minutes using a hot plate to evaporate the solvent. A UV-curable sealant was applied to the external periphery of the hot melt-type member on the sealing case.
Attachment of Substrate with Sealing Case The substrate was transferred, without being exposed to air, into a glove box whose atmosphere was replaced with a nitrogen gas having a dew point temperature of −70° C. The organic EL element on the substrate was placed into contact with and adhered to the hot melt-type member, which had been pre-heated to 90° C., on the sealing case, and irradiated with ultraviolet rays using a 150 W UV lamp from the substrate side to cure the UV-curable sealant. By the thus-conducted sealing, an organic EL display panel was obtained. In the above-mentioned organic EL display panel, the hot melt-type member is arranged between the substrate and the sealing case with no gap. In this structure, the hot melt-type member is directly adhered to the organic EL element.

Example 3

(1) Production of Hot Melt-Type Member Containing Transparent Water-Capturing Agent A hot melt-type member that contained a transparent water-capturing agent was produced in the same manner as in Example 2.

(2) Transferring to Sealing Case (Glass Plate) Using Releasing Film

In a glove box whose atmosphere was replaced with a nitrogen gas having a dew point temperature of −70° C., the hot melt-type member of the present invention was applied to a releasing film using a slot die in such a manner that the resulting hot melt-type member had a thickness of 40 μm (after drying). There is no particular limitation to the coating method, as long as the hot melt-type member can be continuously patterned into a desirable shape on the releasing film. Examples of employable coating methods include gravure coating, screen printing, etc. Thereafter, the solvent was evaporated using a hot plate, obtaining a releasing film (transferring film) with a hot melt-type member. While heating to 60° C., the hot-melt member on the releasing film was transferred, by tangentially attaching, onto a glass sealing case that had been subjected to pre-washing and UV/ozone cleaning, and cooled to 20° C. or less; the releasing film was then removed. A UV-curable sealant was applied to the external periphery of the hot melt-type member on the sealing case.

(3) Attachment of Substrate with Sealing Case

The substrate was transferred, without being exposed to air, into a glove box whose atmosphere was replaced with a nitrogen gas having a dew point temperature of −70° C. The organic EL element on the substrate was placed into contact with and adhered under vacuum to the hot melt-type member on the sealing case, which had been pre-heated to 90° C. The organic EL element was then irradiated with ultraviolet rays using a 150 W UV lamp from the substrate side to cure the UV-curable sealant. Accordingly, an organic EL display panel was obtained. In the above-mentioned organic EL display panel, the hot melt-type member is arranged between the substrate and the sealing case with no gap. In this structure, the hot melt-type member is directly adhered to the organic EL element.

Example 4

(1) Production of Hot Melt-Type Member Containing Transparent Water-Capturing Agent A hot melt-type member that contained a transparent water-capturing agent was produced in the same manner as in Example 2.

(2) Coating to Sealing Case (Glass Plate)

The sealing case was coated in the same manner as in Example 2.

(3) Attachment of Substrate with Sealing Case

Without exposure to air, the substrate was placed in a heat CVD apparatus, and a paraxylene-based insulating layer that functions as a short circuit prevention layer was formed so as to cover the cathode 4 (FIG. 2). Subsequently, the substrate was transferred into a glove box whose atmosphere was replaced with a nitrogen gas having a dew point temperature of −70° C. The organic EL element on the substrate having a short circuit prevention layer was placed into contact with and adhered under vacuum to the hot melt-type member on the sealing case, which had been pre-heated to 90° C., and irradiated with ultraviolet rays using a 150 W UV lamp from the substrate side to cure the UV-curable sealant. By the thus-conducted sealing, an organic EL display panel was obtained. In the above-mentioned organic EL display panel, the hot melt-type member is arranged between the substrate and the sealing case with no gap. In this structure, the hot melt-type member is directly adhered to the organic EL element provided with a short circuit prevention layer.

Example 5

(1) Production of Hot Melt-Type Member Containing Transparent Water-Capturing Agent (Non-Solvent Type)

The commercially available transparent water-capturing agent "OleDry®" (Futaba Corporation; organic metal compound) was used as the water-capturing agent, and a microcrystalline wax (Nippon Seiro Co., Ltd.; product name, Hi-Mic-1070; melting point, 79° C.; number of carbons, about 30 to 60; molecular weight, about 500 to 800) was used as the wax. Microcrystalline wax (3 wt. %) was added per 97 wt. % of the transparent humidity getter. The thus-obtained mixture was subjected to vacuum-drying at 150° C., obtaining a hot melt-type member (non-solvent hot melt-type member) whose weight reduction after vacuum-drying at 150° C. for 4 hours is not greater than 0.01%.

(2) Coating to Sealing Case (Glass Plate)

The substrate was transferred into a glove box whose atmosphere was replaced with a nitrogen gas having a dew point temperature of −70° C. The organic EL element that had been subjected to a pre-wash and UV/ozone cleaning was applied using a slot die in such a manner that the resulting hot-melt type member had a thickness of 30 μm, while heating the hot melt-type member (non-solvent) to 80° C. There is no particular limitation to the coating method, as long as the hot melt-type member can be applied to the top surface of the sealing case (glass plate) by a single wafer process. Alternatively, gravure coating, screen printing, or the like may be employed. A UV-curable sealant was applied to the external periphery of the hot melt-type member on the sealing case.

(3) Attachment of Substrate with Sealing Case

The substrate was transferred, without being exposed to air, into a glove box whose atmosphere was replaced with a nitrogen gas having a dew point temperature of −70° C. The organic EL element on the substrate was placed into contact with and adhered under vacuum to the hot melt-type member on the sealing case, which had been pre-heated to 90° C., and irradiated with ultraviolet rays using a 150 W UV lamp from the substrate side to cure the UV-curable sealant. By the thus-conducted sealing, an organic EL display panel was obtained. In the above-mentioned organic EL display panel, the hot melt-type member is arranged between the substrate and the sealing case with no gap. In this structure, the hot melt-type is directly adhered to the organic EL element.

Comparative Example 1

(1) Production of Resin Member Containing Transparent Water-Capturing Agent OleDry® (Futaba Corporation; organic metal compound) was used as a transparent water-capturing agent, and an acryl-modified urethane was used as a base resin. These components were mixed in a ratio of 50 wt. % OleDry®, 25 wt. % acryl-modified urethane, and 25 wt. % of MEK, obtaining a resin material.

(2) Coating to Sealing Case (Glass Plate)

The resulting resin material was applied to the sealing case in the same manner as in Example 2.

(3) Attachment of Substrate with Sealing Case

The substrate was transferred, without being exposed to air, into a glove box whose atmosphere was replaced with a nitrogen gas having a dew point temperature of −70° C. The organic EL element on the substrate was placed into contact with and adhered under vacuum to the resin member on the sealing case. The organic EL element was then irradiated with ultraviolet rays using a 150 W UV lamp from the substrate side to cure the UV-curable sealant. By the thus-conducted sealing, an organic EL display panel was obtained.

Test Example 1

The shelf life characteristics of each organic EL display panel obtained in each Example and Comparative Example were reviewed. Specifically, accelerated shelf life tests were conducted with placing the organic EL display panels (Examples 1 to 5 and Comparative Example 1) in a high temperature and high humidity condition of 60° C./90% RH, and a high temperature condition of 100° C. Under a high temperature and high humidity condition of 60° C./90% RH, the organic EL display panels obtained in Examples 1 to 5 achieved the light-emission performance almost the same as that before conducting the evaluation test even 1,000 hours after the initiation of the test. In other words, formation and growth of the non-luminous portion was prevented. It was confirmed that the hot melt-type member of the Examples functioned satisfactorily. In contrast, the growth of dark spots due to the generation of outgas, etc., was observed in the organic EL display panel of Comparative Example 1, when only 100 hours had passed. Under a high temperature condition of 100° C., the performance of the organic EL display panel of Example 5 was unchanged even after 500 hours had passed. In other words, a preferable result was obtained even in a test conducted at a high temperature, under which organic EL display panels are susceptible to outgas. It also became clear that no damage due to the cracking of the transparent water-capturing agent was observed in the Examples.

As is clear from the above results, the hot melt-type member of the present invention makes it possible to form a hot melt-type member having a desirable thickness and pattern on a sealing case or releasing film. The present invention provides, in particular, an organic EL element that is free from adverse affects from water or oxygen for a long period of time, and that maintains stable emission characteristics in a form of a thin organic EL display panel that can be reliably mass-produced. By forming a film consisting of a hot melt-type member on the releasing film as in Example 3, continuous production may be achieved, and production efficiency may be improved. Furthermore, the present invention is advantageous in that it can be easily transported to the user's site; its size can be changed relatively easily; and it allows more flexible designing, including application changes at the user's site, etc.

EXPLANATION OF REFERENCE NUMERALS

Figure 1:
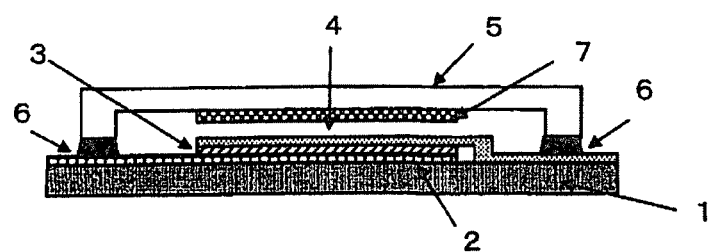
FIG. 1 schematically shows a cross-sectional structure of a known organic EL element.
Figure 2:
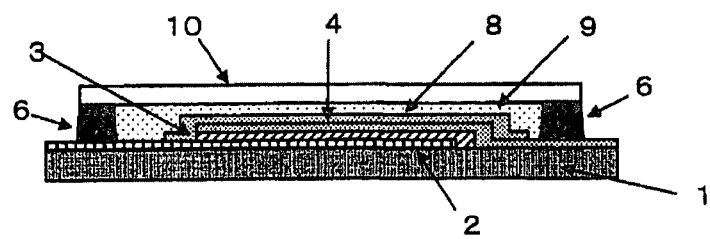
FIG. 2 schematically shows a cross-sectional structure of one example of the organic EL element of the present invention.

1 substrate
2 anode or ITO transparent electrode
3 organic layer or organic film
4 cathode or metal electrode
5 sealing cap
6 UV-curable sealant
7 water-capturing agent
8 short circuit prevention layer
9 adhesive layer (hot-melt member)
10 sealing case

The invention claimed is:

1. An organic EL device having a hot melt-type member comprising a water-capturing agent and wax, wherein the water-capturing agent comprises organic metal compounds, wherein the content of the wax is 1 to 3 wt. % per total weight of the hot melt-type member.

2. The organic EL device having the hot melt-type member according to claim 1, wherein the wax is microcrystalline wax.

3. The organic EL device having the hot melt-type member according to claim 1, wherein the water-capturing agent further comprises inorganic oxide powders having an average particle diameter of not greater than 90 μm.

4. The organic EL device having the hot melt-type member according to claim 1, wherein the content of the water-capturing agent is 50 to 99 wt. % per total weight of the hot melt-type member.

5. The organic EL device having the hot melt-type member according to claim 1, wherein the decrease in weight after conducting vacuum-drying at 150° C. for 4 hours is not greater than 0.1%.

6. The organic EL device having the hot melt-type member according to claim 1, which is in the form of a thin film having a thickness of not greater than 100 μm.

7. The organic EL device having the hot melt-type member according to claim 1, wherein the organic EL device is an organic EL display panel, organic solar cell or organic semiconductor.

8. A transferring film comprising the hot melt-type member of claim 1 on a releasing substrate.

9. The organic EL device having the hot melt-type member according to claim 1, wherein the hot melt-type member is transparent.

10. An organic EL display panel comprising:
a substrate;
an organic EL element formed on the substrate; and
a case encapsulating the organic EL element,
wherein a hot melt-type member comprising a water-capturing agent and wax, wherein the water-capturing agent comprises organic metal compounds, wherein the content of the wax is 1 to 3 wt. % per total weight of the hot melt-type member, is located between the organic EL element and the case.

11. The organic EL display panel according to claim 10, wherein the space between the organic EL element and the case is substantially occupied by the hot melt-type member.

12. The organic EL display panel according to claim 10, which further providing a short circuit prevention layer.

13. The organic EL display panel according to claim 12, wherein the short circuit prevention layer is formed by polyparaxylene.

* * * * *